(12) United States Patent
Takebe et al.

(10) Patent No.: US 6,710,261 B2
(45) Date of Patent: Mar. 23, 2004

(54) CONDUCTIVE BOND, MULTILAYER PRINTED CIRCUIT BOARD, AND METHOD FOR MAKING THE MULTILAYER PRINTED CIRCUIT BOARD

(75) Inventors: Toru Takebe, Tokyo (JP); Yoshio Watanabe, Kanagawa (JP); Kentaro Fujii, Tokyo (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/173,053

(22) Filed: Jun. 18, 2002

(65) Prior Publication Data

US 2003/0006069 A1 Jan. 9, 2003

(30) Foreign Application Priority Data

Jun. 19, 2001 (JP) ..................... P2001-185443

(51) Int. Cl.$^7$ ................................. H05K 1/02
(52) U.S. Cl. .................. 174/259; 174/255; 174/256; 174/261; 361/792
(58) Field of Search ................ 174/259, 255, 174/254, 260, 262, 264, 267, 263, 261; 361/792, 795, 803, 760

(56) References Cited

U.S. PATENT DOCUMENTS

| | | | | |
|---|---|---|---|---|
| 4,696,764 A | * | 9/1987 | Yamazaki | ................ 252/503 |
| 5,046,238 A | * | 9/1991 | Daigle et al. | ................ 29/830 |
| 5,122,215 A | * | 6/1992 | Shibata et al. | ............. 156/250 |
| 5,879,761 A | * | 3/1999 | Kulesza et al. | ............. 427/555 |
| 6,110,399 A | * | 8/2000 | McArdle et al. | ............ 252/513 |
| 6,506,978 B1 | * | 1/2003 | Furihata | ..................... 174/254 |
| 6,518,513 B1 | * | 2/2003 | Enomoto et al. | ........... 174/262 |
| 6,534,723 B1 | * | 3/2003 | Asai et al. | .................. 174/255 |

FOREIGN PATENT DOCUMENTS

| | | |
|---|---|---|
| JP | 7-283539 A1 | 10/1995 |
| JP | 10-322021 A1 | 12/1998 |

* cited by examiner

Primary Examiner—Kamand Cuneo
Assistant Examiner—I B Patel
(74) Attorney, Agent, or Firm—Rader, Fishman & Grauer PLLC; Ronald P. Kananen

(57) ABSTRACT

A conductive bond comprises conductive colloidal particles and a dispersant for dispersing the conductive colloidal particles. A multilayer printed circuit board includes a plurality of substrates, each having a conductive pattern on at least one face thereof. Any adjacent two of the substrates are separated by an insulating layer, and the conductive pattern of a first substrate of the two substrates faces the conductive pattern of a second substrate of the two substrate. The conductive pattern of a first substrate has one or more bumps for electrical connection to the second substrate. The bump and the conductive pattern of the second substrate are bonded to each other with the conductive bond applied to the tip of the bump.

6 Claims, 6 Drawing Sheets

CONDUCTIVE BOND, MULTILAYER PRINTED CIRCUIT BOARD, AND METHOD FOR MAKING THE MULTILAYER PRINTED CIRCUIT BOARD

BACKGROUND OF THE INVENTION

1. Field of the Invention

The present invention relates to a conductive bond that is applied to a bump provided on a substrate when two substrates, each having a conductive pattern, are laminated. The present invention also relates to a multilayer printed circuit board including substrates that are laminated with this conductive bond and a method for making the multilayer printed circuit board.

2. Description of the Related Art

One of the methods for making multilayer printed circuit boards is a build-up process including the steps of forming a conductive pattern on an internal substrate, forming an insulating layer on the conductive pattern, and repeating these steps to form a plurality of conductive layers. If any layer has a defect during the above steps in the build-up process, the resulting multilayer printed circuit board is useless. Thus, this process has low productivity. A countermeasure to overcome such a problem is a method for making a multilayer printed circuit board including independently forming a plurality of substrate, each having a conductive pattern, laminating these substrate with insulating layers provided therebetween, and bonding them.

In this method, a conductive paste is used for tight electrical connection between the layers. Since the conductive paste contains, for example, copper particles with a particle diameter of about 10 μm, and an epoxy resin binder, and a curing agent, the resistance at the connections may be unstable or high in some cases.

Another means for electrical connection between layers includes application of tin-lead solder to a connecting portion of one substrate. Since a flux serves as an impurity for the tin-lead solder, the connection must be performed without using the flux. Thus, the connecting portion does not have satisfactory adhesiveness. Furthermore, the tin-lead solder having a low melting point melts and expands during a reflow process for mounting electronic devices; hence, disconnection between the layers may occur during this step.

Another method for electrical interlayer connection includes bonding laminated substrates with gold as a bond by a thermal contact bonding process. Since the substrates are bonded by resin shrinkage in this method, the bonded portion is unreliable.

SUMMARY OF THE INVENTION

An object of the present invention is to provide a conductive bond that can electrically bond a plurality of substrates by thermal contact bonding at a temperature which is lower than that in known methods.

A further object of the present invention is to provide a conductive bond that can tightly bond a plurality of layers even if the heights of bumps are not uniform.

A still further object of the present invention is to provide a conductive bond that enhances productivity of multilayer printed circuit boards and reliability of connections.

Another object of the present invention is to provide a multilayer printed circuit board of which the layers are bonded with the above conductive bond.

Another object of the present invention is to provide a method for making the multilayer printed circuit board.

A conductive bond according to the present invention comprises conductive colloidal particles and a dispersant for dispersing the conductive colloidal particles. For example, the conductive colloidal particles are composed of silver, gold, and copper. Preferably, the conductive bond further comprises adhesive particles that enhance bonding strength between the two substrates. Preferably, the conductive bond further comprises heating particles that accelerate heating of the conductive bond. Preferably, the adhesive particles have an average particle size in the range of 10 to 100 μm.

The conductive colloidal particles have high activity and a low melting point, which can decrease a processing temperature during a bonding operation and enhance processing efficiency. The conductive bond contains a reduced amount of the resin component compared with known conductive paste; hence, a connection formed by using this conductive bond has low resistance.

A multilayer printed circuit board according to the present invention includes a plurality of substrates, each having a conductive pattern on at least one face thereof, any adjacent two of the plurality of substrates being separated by an insulating layer, wherein the conductive pattern of a first substrate of the two substrates faces the conductive pattern of a second substrate of the two substrate. The conductive pattern of a first substrate has at least one bump for electrical connection to the second substrate. The bump and the conductive pattern of the second substrate are bonded to each other with a conductive bond applied to the tip of the bump. The conductive bond comprises conductive colloidal particles and a dispersant for dispersing the conductive colloidal particles.

Since the conductive bond is used for the connections between the bumps and the lands of the multilayer printed circuit board, the multilayer printed circuit board can be produced with high efficiency and the connections have low electrical resistance.

A method for making a multilayer printed circuit board according to the present invention comprises the steps of: forming at least one bump on a conductive layer on at least one face of a first substrate; patterning the conductive layer to form a conductive pattern; patterning a conductive layer on at least one face of a second substrate; applying a conductive bond to the tip of the bump; laminating the first substrate and the second substrate with an insulating layer provided therebetween such that the conductive pattern of the first substrate faces the conductive pattern of the second substrate; and electrically connecting the opposing conductive patterns through the bump by thermal contact bonding, wherein the conductive bond comprises conductive colloidal particles and a dispersant for dispersing the conductive colloidal particles.

DESCRIPTION OF THE PREFERRED EMBODIMENTS

A multilayer printed circuit board according to the present invention will now be described with reference to the attached drawings.

Figure 1:
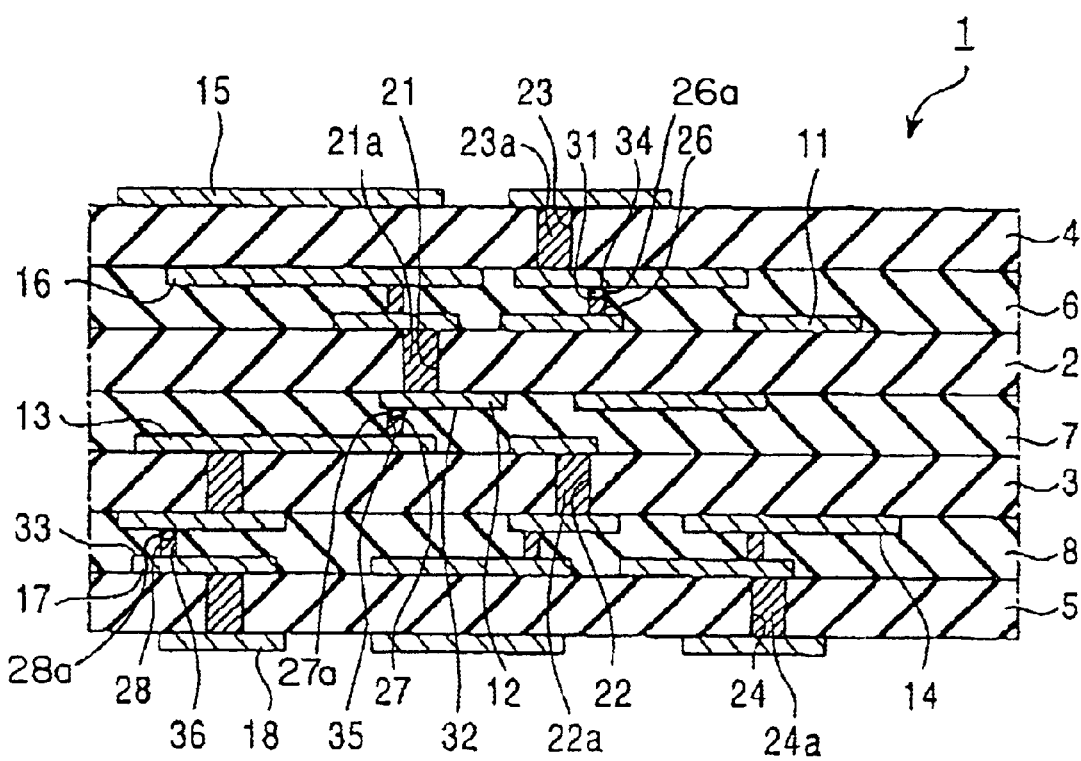
FIG. 1 is a cross-sectional view of a main portion of a multilayer printed circuit board according to the present invention.

Referring to FIG. 1, the multilayer printed circuit board 1 according to the present invention includes internal substrates 2 and 3 and external substrates 4 and 5. These substrates 2, 3, 4, and 5 are laminated with prepreg layers 6, 7, and 8 as insulating layers to form a composite.

For example, the internal substrates 2 and 3 and the external substrates 4 and 5 are formed of fiber-reinforced resin of glass fibers impregnated with an epoxy resin. Two faces of the internal substrate 2 have conductive patterns 11 and 12, respectively, whereas two faces of the internal substrate 3 have conductive patterns 13 and 14, respectively. Similarly, two faces of the external substrate 4 have conductive patterns 15 and 16, respectively, whereas two faces of the external substrate 5 have conductive patterns 17 and 18, respectively. The conductive patterns 11 and 12 of the internal substrate 2 are connected by a through hole 21 filled with a conductive paste 21a, the conductive patterns 13 and 14 of the internal substrate 3 by a through hole 22 filled with a conductive paste 22a: the conductive patterns 15 and 16 of the external substrate 4 by a through hole 23 filled with a conductive paste 23a, and the conductive patterns 17 and 18 of the external substrate 5 by a through hole 24 filled with a conductive paste 24a. Alternatively, the two conductive patterns may be connected with, for example, electroless copper plating layers formed on the walls of the through hole 21, 22, 23, and 24.

The conductive pattern 11 provided on the upper surface of the internal substrate 2 is provided with bumps 26 for connecting the conductive pattern 11 to the conductive pattern 16 of the external substrate 4, the internal substrate 2 and the external substrate 4 being separated by the prepreg layers 6 provided therebetween. These bumps are electrically connected to the land 31 of the conductive pattern 16 of the external substrate 4. The internal substrate 3 is provided with a bump 27 on the conductive pattern 13. The bump 27 electrically connects the conductive pattern 13 of the internal substrate 3 to the land 32 of the conductive pattern 12 of the internal substrate 2 through conductive bond 27a, the internal substrates 2 and 3 being separated by the prepreg layer 7 provided therebetween. The bumps 28 electrically connect the conductive pattern 14 of the internal substrate 3 to the land 33 of the conductive pattern 17 on the external substrate 5 through conductive bond 28a, the internal substrate 3 and the external substrate 5 being separated by the prepreg layer 8 provided therebetween. These bumps 26, 27, and 28 are connected to the lands 31, 32, and 33, respectively, with a conductive bond according to the present invention. The bumps 26, 27, and 28, respectively, extend inside through holes 34, 35, and 36 that are formed in the prepreg layers 6, 7, and 8, and are connected to the lands 31, 32, and 33.

Figure 2:
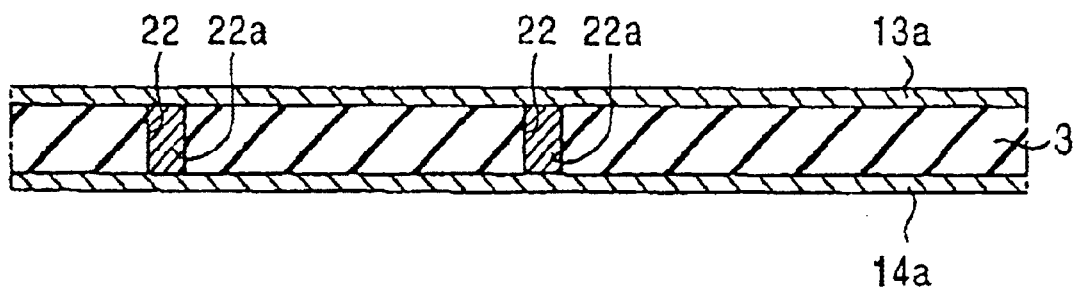
FIG. 2 is a cross-sectional view of a main portion of an internal substrate provided with conductive layers of copper foils on two faces thereof.

A method for making the multilayer printed circuit board 1 will now be described with reference to the drawings. First, internal substrates 2 and 3 are formed. Referring to FIG. 2, for example, the internal substrate 3 has two faces having conductive layers 13a and 14a of copper foils. The internal substrate 3 has though holes 22 for interlayer connection between the conductive layers 13a and 14a. The though holes 22 are formed by, for example, drilling and are filled with a conductive paste 22a. Alternatively, the though holes 22 may each have a plating layer formed by copper electroless plating or copper electroplating on the wall thereof. The plated layers on the walls of the though holes 22 connect the conductive layers 13a and 14a.

Figure 3:
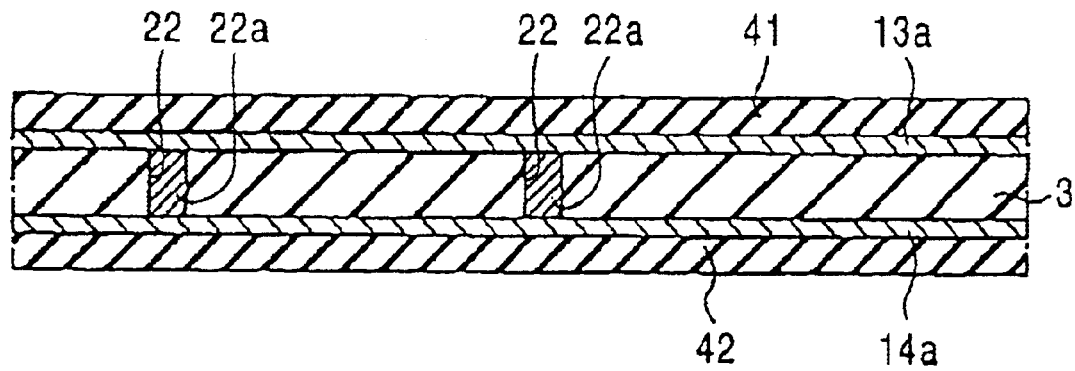
FIG. 3 is a cross-sectional view of the main portion of the internal substrate provided with dry films on the copper foils in FIG. 2.
Figure 4:
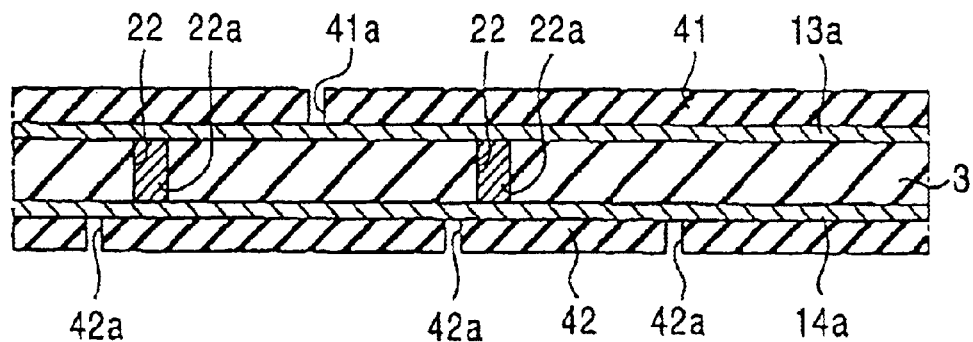
FIG. 4 is a cross-sectional view of the main portion of the internal substrate provided with recesses that are formed by exposure and development of the dry films in FIG. 3.
Figure 5:
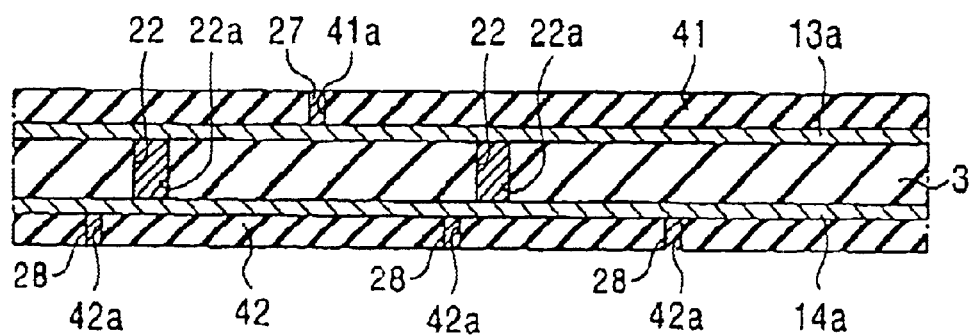
FIG. 5 is a cross-sectional view of the main portion of the internal substrate provided with the recesses filled with copper.

Referring to FIG. 3, photosensitive dry films 41 and 42 are bonded on the conductive layers 13a and 14a, respectively. The dry films 41 and 42 are exposed through exposure films having exposure patterns corresponding to bumps to be formed, and are developed. Referring to FIG. 4, recesses 41a and 42a are thereby formed in the dry films 41 and 42, respectively. The conductive layers 13a and 14a are exposed at the bottoms of the recesses 41a and 42a. Referring to FIG. 5, the recesses 41a and 42a are filled with copper that is deposited by electroless plating or electroplating. The copper columns formed in the recesses 41a and 42a function as bumps 27 and 28, respectively, that connect the conductive layers 13a and 14a.

Figure 6:
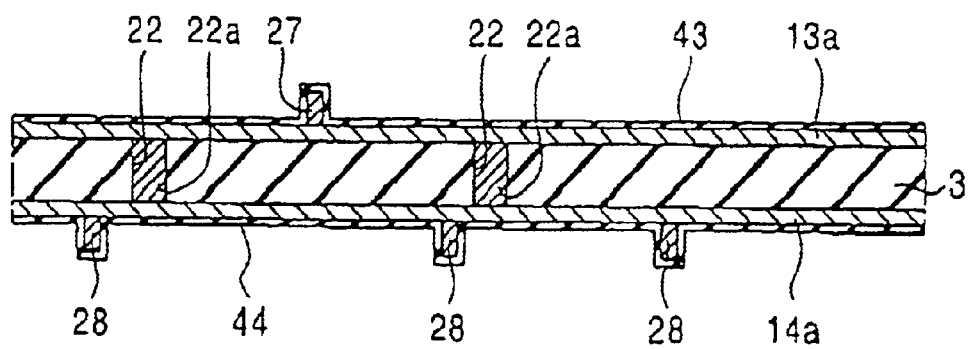
FIG. 6 is a cross-sectional view of the main portion of the internal substrate provided with resists formed on the copper foil in FIG. 5.
Figure 7:
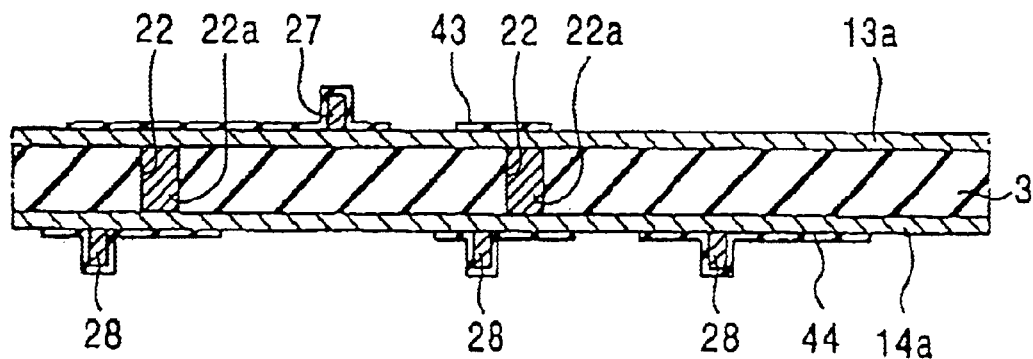
FIG. 7 is a cross-sectional view of the main portion of the internal substrate provided with the resists that are selectively removed from regions in which conductive patterns are not formed.
Figure 8:
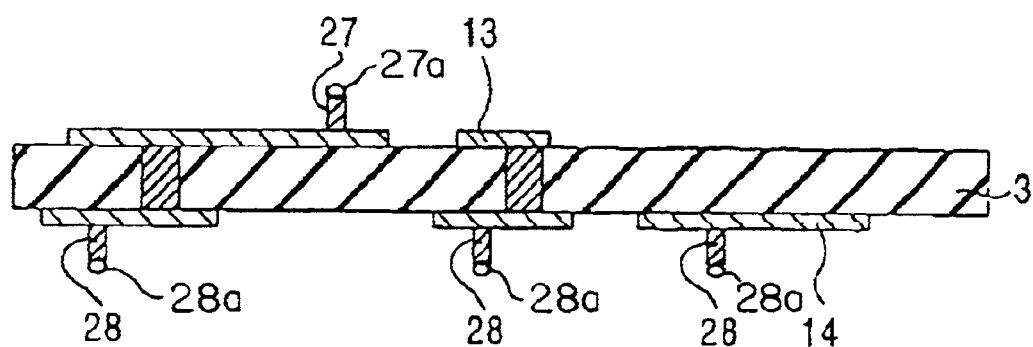
FIG. 8 is a cross-sectional view of the main portion of the internal substrate provided with the conductive patterns.

Referring to FIG. 6, the dry films 41 and 42 are delaminated from the internal substrate 3. Resists 43 and 44 are electrodeposited over the conductive layers 13a and 14a and the bumps 27 and 28. The resists 43 and 44 are exposed through exposure films having exposure patterns corresponding to conductive patterns and are developed. Referring to FIG. 7, resists 43 and 44 are removed from regions in which the conductive patterns are not formed. Referring to FIG. 8, the conductive layers 13a and 14a are selectively etched in the region in which the resists 43 and 44 are removed. Then, the resists 43 and 44 remaining on the conductive layers 13a and 14a are removed. As a result, the conductive patterns 13 and 14 are formed on the internal substrate 3 and the bumps 27 and 28 are formed on the conductive patterns 13 and 14, respectively.

Figure 9:
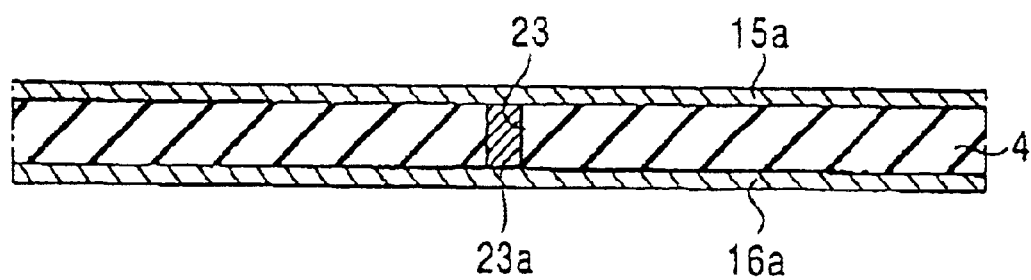
FIG. 9 is a cross-sectional view of a main portion of an external substrate provided with conductive layers of copper foils on two faces thereof.

A method for making external substrates 4 and 5 having no bump will now be described. Referring to FIG. 9, for example, the external substrate 4 has two faces having conductive layers 15a and 16a of copper foils. The external substrate 4 has a though hole 23 for interlayer connection between the conductive layers 15a and 16a. The though hole 23 is formed by, for example, drilling and is filled with a conductive paste 23a. Alternatively, the though hole 23 may have a plating layer formed by copper electroless plating or copper electroplating on the wall thereof. The plated layer on the wall of the though hole 23 connects the conductive layers 15a and 16a.

Figure 10:
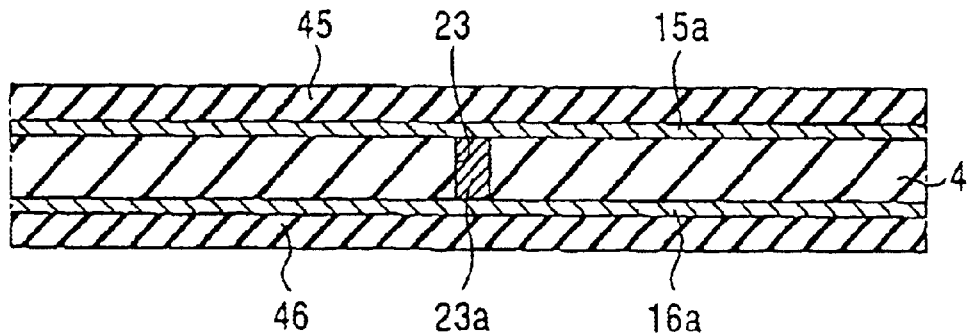
FIG. 10 is a cross-sectional view of the main portion of the external substrate provided with dry films on the copper foils in FIG. 9.
Figure 11:
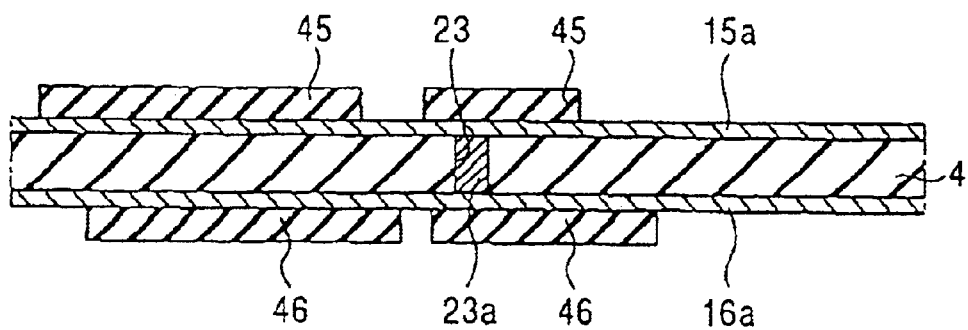
FIG. 11 is a cross-sectional view of the main portion of the external substrate provided with the dry films that are selectively removed from regions in which conductive patterns are not formed.
Figure 12:
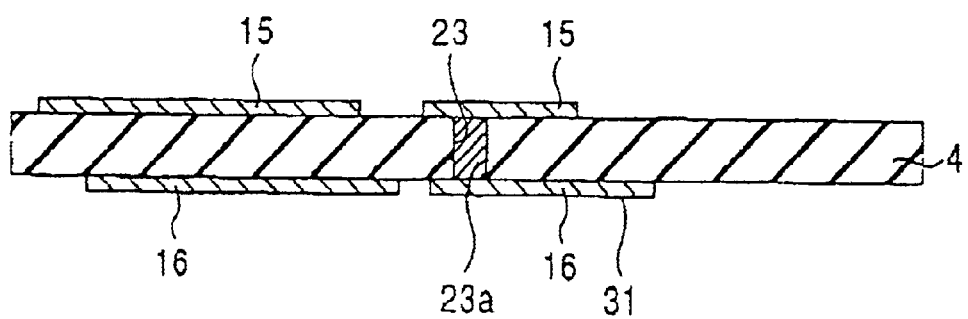
FIG. 12 is a cross-sectional view of the main portion of the external substrate provided with the conductive patterns.

Referring to FIG. 10, photosensitive dry films 45 and 46 are bonded on the conductive layers 15a and 16a, respectively. The dry films 45 and 46 are exposed through exposure films having exposure patterns corresponding to conductive patterns to be formed, and are developed. Referring to FIG. 11, dry films 45 and 46 are removed from regions in which the conductive patterns are not formed. Referring to FIG. 12, the conductive layers 15a and 16a are selectively etched in the region in which the dry films 45 and 46 are removed. The dry films 45 and 46 remaining on the conductive layers 15a and 16a are removed. As a result, the conductive patterns 15 and 16 are formed on the two faces of the external substrate 4, and the exposed face of the conductive pattern 16 functions as lands 31. Preferably, each land 31 is plated or soldered with tin, silver, or an alloy thereof. The other lands 32 and 33 shown in FIG. 1 are also plated as in the lands 31.

The external substrate 5 shown in FIG. 1 is also processed as in the external substrate 4. The conductive pattern 12 of the internal substrate 2 has lands but no bump. The conductive pattern 11 of the internal substrate 2 may be processed as in the internal substrate 3, whereas the conductive pattern 12 may be processed as in the external substrate 4.

Figure 13:
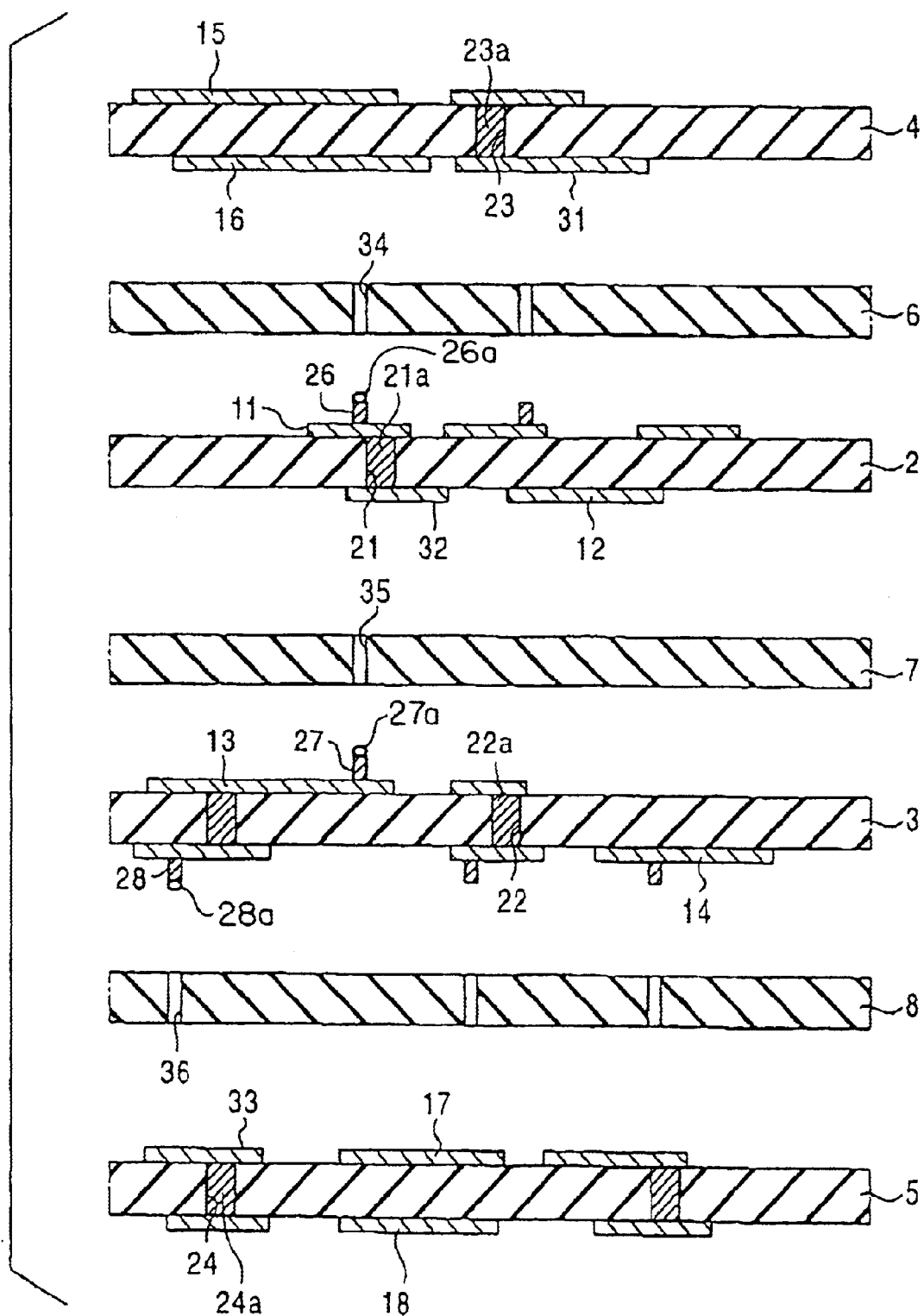
FIG. 13 is a cross-sectional view for illustrating arrangement of prepreg layers between substrates.

Referring to FIG. 13, insulating prepreg layers 6, 7, and 8 are disposed between the internal and external substrates 2 to 5. The prepreg layers 6, 7, and 8 are fiber-reinforced resin sheets of, for example, glass fibers impregnated with epoxy resin. The prepreg layers 6, 7, and 8 have through holes 34, 35, and 36, which have been formed by, for example, drilling. The bumps 26, 27, 28 are inserted into the through holes 34, 35, and 36.

Conductive bonds 26a, 27a and 28a according to the present invention are applied to the bumps 26, 27, and 28, respectively, of the internal substrates 2 and 3. The conductive bond comprises conductive colloidal particles and a dispersant that uniformly disperses the conductive colloidal particles. The conductive colloidal particles have a size in the range of several nanometers to several hundred nanometers. For example, such conductive colloidal particles may be formed by evaporating a metal in an inert gas, i.e. helium or argon and rapidly cooling metal atoms by collision with gas molecules to condense gaseous metal. The conductive colloidal particles have high activity and a low melting point. For example, pure silver has a melting point of 960.8° C. while its colloidal particles have a melting point of about 260° C. Thus, the conductive bonds 26a, 27a and 28a aaccording to the present invention permit satisfactory bonding of the bumps 26, 27, and 28, respectively, to the land 31, 32, and 33, respectively, at a low bonding temperature.

Preferably, the conductive colloidal particles are composed of silver that is barely oxidized. The silver colloidal particles preferably have a diameter of 10 nm to 50 nm so that the colloidal particles are satisfactorily dispersed into the dispersant. Colloidal particles having a diameter larger than 50 nm are barely dispersed in the dispersant. The lower limit of the colloidal particles by virtue of practical production is 10 nm, although it is preferable that the particle size be as small as possible.

The conductive bonds 26a, 27a and 28a contain the above colloidal particles and resin as the dispersant. An exemplary material for the dispersant is an acrylic resin. The dispersant is generally compounded in an amount of 6 percent by weight to 94 percent by weight of the colloidal particles after drying. That is, the conductive bond according to the present invention has a resin content that is smaller than that in known conductive pastes and thus decreases bonding resistance between the bumps 26, 27, and 28 and the lands 31, 32, and 33. The resin used as the dispersant has a molecular weight of about 10,000.

The conductive bonds 26a, 27a and 28a may contain particles having a particle size, i.e. about 10 $\mu$m, that is larger than that of the colloidal particles. The particles are composed of, for example, a tin-silver alloy that improves adhesiveness to the lands 31, 32, and 33. The tin-silver alloy has a composition of 3.5% silver and 96.5% tin. The conductive bonds 26a, 27a and 28a are applied to the tips of the bump 26, 27, and 28, respectively, because the conductive bond exhibits high affinity for the tin-silver solder or plate on the lands 31, 32, and 33. The adhesiveness between the bumps 26, 27, and 28 and the lands, 31, 32, and 33, respectively, are thereby improved. The silver-tin particles, which are larger than the conductive colloidal particles, ensure bonding of the bumps 26, 27, and 28 to the lands 31, 32, and 33, respectively, even if these bumps have rough surfaces.

The ratio of the silver colloidal solution containing silver colloidal particles, the dispersant, and water to the tin-silver alloy is in the range of 1:1 to 10:1 by weight. This ratio is determined in view of the adhesiveness of the bumps 26, 27, and 28 to the lands 31, 32, and 33 and the variation in height of the bumps 26, 27, and 28.

The conductive bonds 26a, 27a and 28a may further contain silver-coated copper particles in place of or together with the tin-silver alloy to improve the adhesiveness of the bump 26, 27, and 28 to the lands 31, 32, and 33, respectively. The silver-coated particles have a diameter of, for example. 10 to 100 $\mu$m. The conductive bonds 26a, 27a and 28a containing the silver-coated particles have high affinity for both the tin-silver solder or plate applied to the lands 31, 32, and 33 and the copper foil lands 31, 32, and 33. The conductive bonds 26a, 27a and 28a achieve tight bonding even if the bumps 26, 27, and 28 have different heights.

Furthermore, the conductive bonds 26a, 27a and 28a may contain heating particles that accelerate heating of the conductive bonds. The heating particles have a size of about 10 to 100 $\mu$m. The heating particles ensure bonding of the bumps 26, 27, and 28 to the lands 31, 32, and 33, respectively, when the substrates 2, 3, 4, and 5 are heated with the prepreg layers 6, 7, and 8 for contact bonding. Examples of materials for the heating particles include graphite, ferrite, silicon carbide, barium titanate, and alumina.

The conductive bond having the above composition is modified with 25 percent by weigh of water so as to have a viscosity of 10 p (poises) and is stocked in a reservoir. The tips of the bumps 26, 27, and 28 are dipped into the conductive bond in the reservoir and are dried, for example, at 100° C. for 1 minute. The conductive bond adheres on the tips of the bumps 26, 27, and 28. Other methods for applying the conductive bonds 26a, 27a and 28a to the tips of the bumps 26, 27, and 28 include ink-jet processes, printing processes, and dispensing processes.

The substrates 2, 3, 4, and 5 are bonded to each other with the prepreg layers 6, 7, and 8 disposed therebetween. Specifically, the prepreg layer 6 is disposed between the external substrate 4 and the internal substrate 2 to ensure insulation between the conductive pattern 16 and the conductive pattern 11, the prepreg layer 7 is disposed between the internal substrate 2 and the internal substrate 3 to ensure insulation between the conductive pattern 12 and the conductive pattern 13, and the prepreg layer 8 is disposed between the internal substrate 3 and the external substrate 5 to ensure insulation between the conductive pattern 14 and the conductive pattern 17.

The laminate of the substrates 2, 3, 4, and 5 and the prepreg sheets 6, 7, and 8 is placed into a pressure device with a maximum pressure of at least 30 kg/cm$^2$ and a maximum heating temperature of 300° C. In the method for making the multilayer printed circuit board 1 using a conductive bond containing silver colloidal particles, the laminate is pressed under a pressure of 30 kg/cm$^2$ at 130° C. for 30 minutes to melt the epoxy resin in the prepreg layers 6, 7, and 8, under the same pressure at 180° C. for 70 minutes to cure the epoxy resin, and then under the same pressure at 260° C. for 10 minutes to melt the connection between the bumps 26, 27, and 28 and the lands 32, 33, and 34. The multilayer printed circuit board 1 shown in FIG. 1 is thereby formed.

In radio-frequency heating, the laminate is heated under a pressure of 30 kg/cm$^2$ at 130° C. for 30 minutes and then is heated under the same pressure at 180° C. for 70 minutes to cure epoxy resin. Preferably, the frequency is 2.45 GHz, the output is 500 W, and the RF heating time is 1 to 2 minutes.

As described above, in the present invention, the conductive bond is used for bonding of the bumps 26, 27, and 28 to the lands 31, 32, and 33, respectively, in the multilayer printed circuit board 1. The bumps 26, 27, and 28 can be bonded to the lands 31, 32, and 33 at low temperatures because of the colloidal particles having lower melting points, resulting in improved productivity. Since the conductive bond according to the present invention has a low resin content compared with known conductive pastes, the connections between the bumps 26, 27, and 28 and the lands 31, 32, and 33, respectively, have low electrical resistance. Furthermore, microparticles together with nanocolloidal particles contained in the conductive bond enhances adhesiveness between the bumps 26, 27, and 28 and the lands 31, 32, and 33, respectively, accelerate heating of the conductive bond, and facilitates melting at the connections, even if the bumps 26, 27, and 28 have different heights.

Table 1 shows the resistance at the connection between the bumps 26, 27, and 28 (diameter: 0.1 mm) and the lands 31, 32, and 33.

TABLE 1

| Type of Conductive Bond | Resistance (mΩ) |
| --- | --- |
| Copper Plate | 1 |
| Colloidal Silver + Tin-Silver Alloy | 23 |
| Colloidal Silver + Silver-Coated Copper Particles | 2 |
| Colloidal Silver + Silver-Coated Copper Particles + Graphite | 10 |
| Copper Paste | 180 |

Table 1 shows that conductive bonds according to the present invention (colloidal silver+tin-silver alloy, colloidal silver+silver-coated copper particles, and colloidal silver+ silver-coated copper particles+graphite) have significantly low electrical resistance compared with that of the copper paste. The electrical resistance of the conductive bonds is very similar to that of the copper plate.

In the above embodiments, the conductive bond contains silver colloidal particles. The silver colloidal particles may be replaced with, for example, gold colloidal particles or copper colloidal particles.

The conductive bond is used for bonding the bumps 26, 27, and 28 to the lands 31, 32, and 33, respectively, in the above embodiments. The conductive bond also may be applicable to mounting electronic devices onto a printed circuit board.

What is claimed is:

1. A multilayer printed circuit board comprising:

plurality of substrates, each having a conductive pattern on at least one face thereof, any adjacent two of said plurality of substrates being separated by an insulating layer, wherein the conductive pattern of a first substrate of the two substrates faces the conductive pattern of a second substrate of the two substrates;

the conductive pattern of a first substrate having at least one bump for electrical connection to the second substrate;

wherein the bump and the conductive pattern of the second substrate are bonded to each other with a conductive bond applied to the tip of the bump; and the conductive bond comprises conductive colloidal particles and a dispersant for dispersing the conductive colloidal particles.

2. The multilayer printed circuit board according to claim 1, wherein the conductive bond further comprises adhesive particles that enhance bonding strength between the two substrates.

3. The multilayer printed circuit board according to claim 2, wherein the adhesive particles have an average particle size in the range of 10 to 100 μm.

4. The multilayer printed circuit board according to claim 1, wherein a thermal contact bond joins the plurality of substrates and the insulating layer to one another.

5. The multilayer printed circuit board according to claim 4, wherein the conductive bond further comprises heating particles that accelerate heating of the conductive bond.

6. The multilayer printed board as set forth in claim 1, wherein the conductive colloidal particles are silver colloidal particles.

* * * * *